(12) United States Patent
Akkermans et al.

(10) Patent No.: US 8,587,769 B2
(45) Date of Patent: Nov. 19, 2013

(54) STAGE APPARATUS AND LITHOGRAPHIC APPARATUS COMPRISING SUCH STAGE APPARATUS

(75) Inventors: Johannes Antonius Gerardus Akkermans, Eindhoven (NL); Theodorus Petrus Maria Cadee, Vlierden (NL); George Wilhelmus Johannes Clijsen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 317 days.

(21) Appl. No.: 13/100,740

(22) Filed: May 4, 2011

(65) Prior Publication Data

US 2011/0299057 A1    Dec. 8, 2011

Related U.S. Application Data

(60) Provisional application No. 61/351,157, filed on Jun. 3, 2010.

(51) Int. Cl.
*G03B 27/58* (2006.01)
*G03B 27/62* (2006.01)

(52) U.S. Cl.
USPC .............................. 355/72; 355/75

(58) Field of Classification Search
USPC ............................ 355/53, 72–76; 368/10, 21; 327/157–158
See application file for complete search history.

(56) References Cited

U.S. PATENT DOCUMENTS

| | | | |
|---|---|---|---|
| 6,873,573 B2 * | 3/2005 | Pikula et al. | ..................... 368/10 |
| 7,072,432 B2 | 7/2006 | Belcea | |
| 7,151,945 B2 | 12/2006 | Myles et al. | |
| 7,489,168 B2 | 2/2009 | Lee | |
| 2009/0259337 A1 | 10/2009 | Harrold et al. | |
| 2011/0051108 A1 | 3/2011 | Shibazaki | |
| 2011/0053061 A1* | 3/2011 | Shibazaki | ....................... 430/30 |

FOREIGN PATENT DOCUMENTS

| | | |
|---|---|---|
| JP | 10-270535 | 10/1998 |
| JP | 11-154914 | 6/1999 |
| JP | 2000-240717 | 9/2000 |
| JP | 2004-325162 | 11/2004 |
| JP | 2005-072677 | 3/2005 |
| JP | 2005-109137 | 4/2005 |

(Continued)

OTHER PUBLICATIONS

Japanese Office Action mailed Nov. 6, 2012 in corresponding Japanese Patent Application No. 2011-123061.

*Primary Examiner* — Hung Henry Nguyen
(74) *Attorney, Agent, or Firm* — Pillsbury Winthrop Shaw Pittman LLP

(57) ABSTRACT

A stage apparatus to position an object, the stage apparatus including a table configured to hold the object, a support structure configured to support the table, the table being displaceable relative to the support structure, the support structure including one of a first data clock and a second data clock and the table including the other one of the first data clock and the second data clock; and a circuit configured to synchronize the first and second data clocks, the circuit including a transmitter and receiver, the transmitter configured to wirelessly transmit clock signal data from the first data clock to the second data clock, and a synchronization circuit configured to synchronize the second data clock with the first data clock from the wirelessly transmitted clock signal data received by the receiver.

13 Claims, 3 Drawing Sheets

(56) References Cited

FOREIGN PATENT DOCUMENTS

| | | |
|---|---|---|
| JP | 2007-115784 | 5/2007 |
| JP | 2007-514319 | 5/2007 |
| JP | 2007-189180 | 7/2007 |
| JP | 2007-274881 | 10/2007 |
| JP | 2008-300477 | 12/2008 |
| JP | 2009-253291 | 10/2009 |
| WO | 2005/081290 | 9/2005 |
| WO | 2006/085511 | 8/2006 |
| WO | 2007/113955 | 10/2007 |
| WO | 2009/078154 | 6/2009 |

* cited by examiner

STAGE APPARATUS AND LITHOGRAPHIC APPARATUS COMPRISING SUCH STAGE APPARATUS

CROSS REFERENCE TO RELATED APPLICATIONS

This application claims priority and benefit under 35 U.S.C. §119(e) to U.S. Provisional Patent Application No. 61/351,157, entitled "Stage Apparatus and Lithographic Apparatus Comprising Such Stage Apparatus", filed on Jun. 3, 2010. The content of that application is incorporated herein in its entirety by reference.

FIELD

The present invention relates to a stage apparatus and to a lithographic apparatus comprising such stage apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, use is made of stages, such as a substrate stage or a patterning device stage that is movable so as to position the substrate respectively the patterning device, which stage is provided with a cable connection, e.g. to provide electric power to actuators (such as a short stroke motor), sensors (such as encoder measurement heads mounted on the stage), etc. The cable, due to its inherent properties such as its stiffness, may contribute to sources of mechanical disturbance when positioning/moving the stage with high accuracy and/or high speed. Therefore, it may be desirable to be able to provide a stage in which wired connections are omitted as much as possible.

Clock data may be transmitted to the stage. The clock data may for example be used to clock (i.e. to time) position measurements of the stage, e.g. during movement of the stage. In case the stage is equipped with encoder measurement heads, the measurements by the encoder measurement heads may for example be clocked. Given a range of movement of the stage, a wireless transmission of clock data to the stage would result in varying delay of the wireless transmission of the clock data: as a propagation path of the transmission would vary depending on a length of the transmission path. As a result, the clock data as received at the stage would exhibit a delay in dependency of the position of the stage. Given high speeds of movement of the stage and high positioning accuracy requirements, it may be desirable to determine a position of the stage—e.g. during a movement—with high accuracy in terms of the position itself, as well as in terms of the time at which that position is measured. Thereto, an accurate clock may be desirable.

SUMMARY

It is desirable to provide a wireless transmission of clock data to a movable stage, whereby a propagation delay dependency on a length of a propagation path is at least partly compensated.

According to an embodiment of the invention, there is provided a stage apparatus to position an object, the stage apparatus including a table to hold the object, a support structure to support the table, the table being displaceable relative to the support structure, wherein the support structure includes one of a first data clock and a second data clock and the table includes the other one of the first data clock and the second data clock, the stage apparatus including a circuit to synchronize the data clocks, the circuit including: a transmitter-receiver combination configured to wirelessly transmit clock signal data from the first data clock to the second data clock, and a synchronization circuit to synchronize the second data clock to the first data clock from the wirelessly transmitted clock signal data as received by the receiver.

In another embodiment of the invention, there is provided a lithographic apparatus including such stage apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
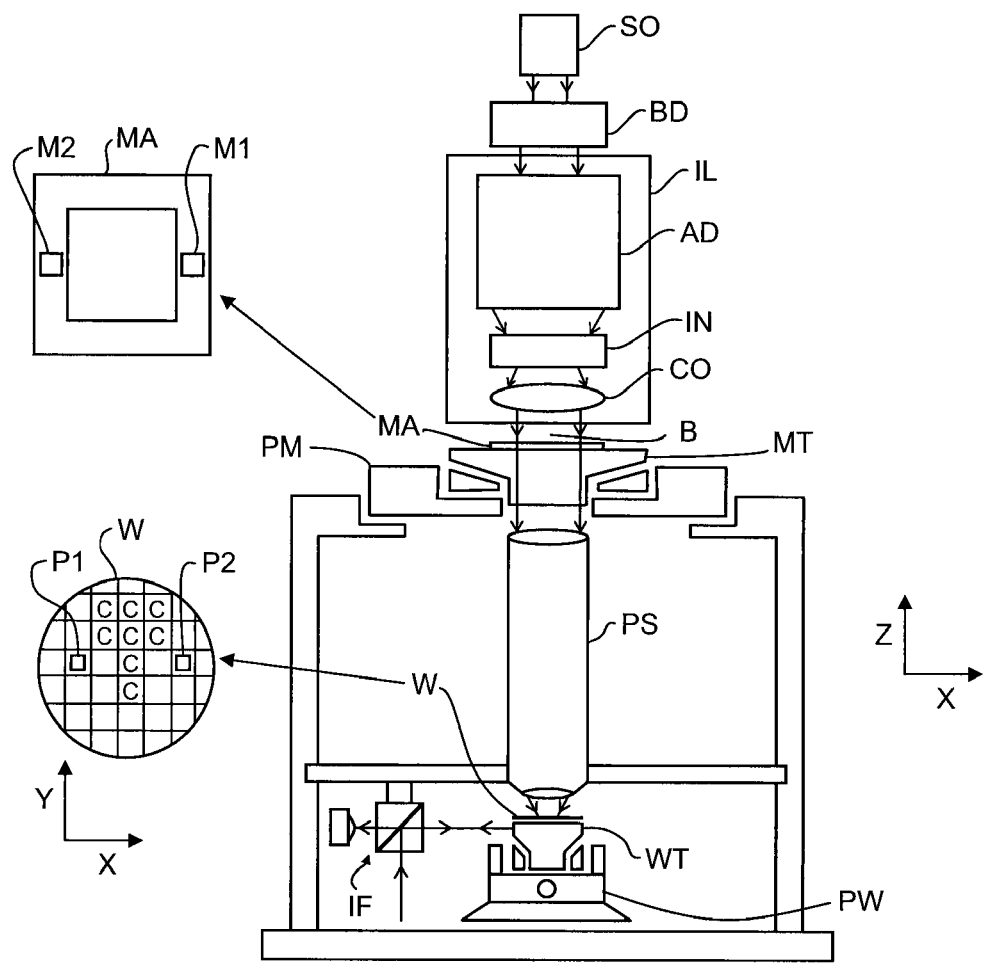
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:
1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
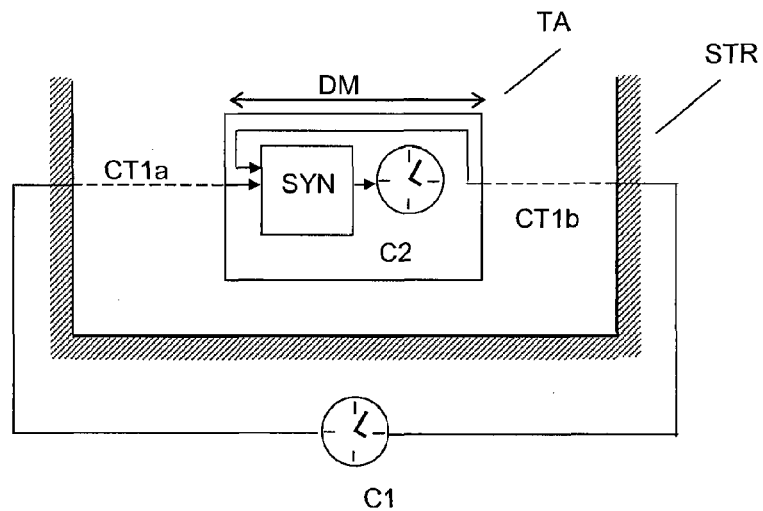
FIG. 2 depicts a schematic view of a stage apparatus according to an embodiment of the invention.

FIG. 2 highly schematically depicts a stage apparatus comprising a table TA which is movable in respect of a support structure STR. The table is, in this example movable in a direction of movement indicated by the arrow DM. The table may for example be formed by a substrate table or a mask table (i.e. a support) of a lithographic apparatus. The support structure may be formed by a reference frame (such as a metrology frame) or other stationary structure. The support structure may also be formed by a movable structure, such as a long stroke actuator: in such case, the direction of movement may be formed by a short stroke actuator direction of movement e.g. of the lithographic apparatus. The concept as explained with reference to FIGS. 2 and 3 may be applied for example in situations wherein the table is movable is a single direction, such as the direction of movement DM. A first data clock C1 is provided at the support structure STR: the first data clock may be generated at the support structure, or may be transmitted to the support structure via any suitable transmitter, such as a wired or wireless data clock signal, data clock bus, etc. A second data clock C2 is provided at the table TA. The second data clock may be provided by a suitable data clock generator, such as a synchronisable data clock generator, and/or may be derived from the wirelessly transmitted clock signal data as explained below. As depicted in FIG. 2, the first data clock C1 is transmitted to the table TA via dual (wireless) transmission paths: firstly, a transmission path CT1$a$ is provided, and secondly a transmission path CT1$b$ is provided. Thereto, corresponding transmitters are provided at the support structure STR and corresponding receivers are provided at the table TA. The table TA hence receives clock data from the first clock C1 twice. The table TA may move along the direction of movement DM. Therefore, a length of the paths CT1$a$ and CT1$b$ may vary. As a result, a delay via each of the paths CT1$a$ and CT1$b$ may vary in dependency of the position of the table TA in respect of the support structure STR. The clock data as transmitted along the two transmission paths is thus received twice at the table TA. The more the table TA is moved along the direction DM to one side, the shorter one of the transmission paths (hence the shorter the delay via that transmission path), while the longer the other one of the transmission paths (thus the longer the delay via that transmission path), as the transmission paths extend oppositely directed along the direction of movement DM. Both the clock data as received via the wireless transmission paths are provided to a synchronization circuit SYN which is arranged to mix the clock data as received via both of the transmission paths and derive a synchronization for the second data clock C2 there from. In an embodiment, the synchronization circuit may essentially synchronize the second data clock C2 to an average of the delay via the transmission paths. In addition to such averaging, a constant (e.g. calibrated) delay may be added, so as to compensate for example for path length, delay of transmission-, reception-, and/or processing electronics.

It will be appreciated that in a causal system, negative delays that compensate for real world delays, may be impossible. However, as the data clocks provide a period signal, a delay of 360 phase shift effectively results in a zero delay, thus delays encountered in for example transmission-, reception-, and/or processing electronics, along the transmission paths, etc, may be compensated by a further delay so as to result in a substantially identical steady state behavior.

Figure 3:
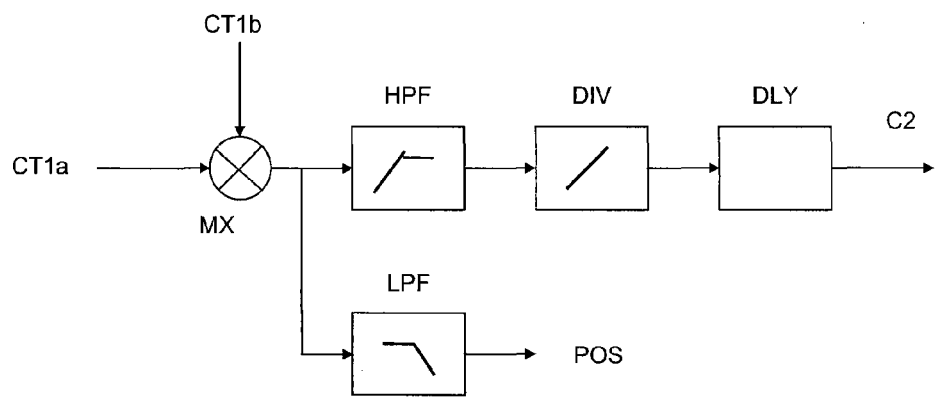
FIG. 3 depicts a schematic block diagram of a part of a synchronization circuit of the stage apparatus in accordance with FIG. 2 according to an embodiment of the invention.

FIG. 3 depicts a block schematic circuit to illustrate an embodiment of the synchronization circuit of the embodiment as described with reference to FIG. 2. The clock data as received via the transmission paths CT1$a$ and CT1$b$ is provided to a mixer MX. As both received clock data have a same frequency, however may differ in phase, the mixer at its output provides a signal component at substantially twice the data clock frequency and a substantially constant (DC-direct current) signal component. The signal component at twice the data clock frequency is selected by a high pass filter HPF, the remaining signal being divided e.g. by a factor 2 in frequency by a divider DIV. As the signal component at twice the frequency may be expressed as a sum of the clock frequencies as received along the two transmission paths and a sum of the phases as received along the two transmission paths, the sum of the phases will be constant, irrespective of the position of the table TA along the direction of movement DM. An output signal of the divider—which hence provides an accurate, constant phase shift independent of the position of the table TA, is further delayed by delay unit DLY in order to at least partially compensate for the delays encountered in for example transmission-, reception-, and/or processing electronics, along the transmission paths, etc.

The other signal component at the output of the mixer MX substantially corresponds to a difference in frequency and phase between the clock data from CT1$a$ and CT1$b$. As the received frequencies may be substantially the same, a signal component which expresses a difference in phase remains. As the difference in phase is position dependent, position data POS representative of the position of the table TA may be derived from the output of low pass filter LPF.

Figure 4:
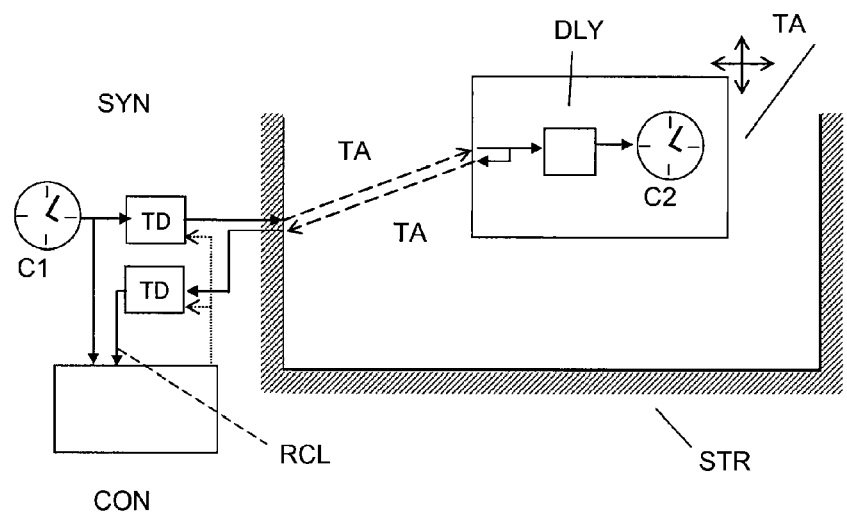
FIG. 4 depicts a schematic view of a stage apparatus according to another embodiment of the invention.

FIG. 4 depicts another embodiment which may be applied in case of a table TA having a range of movement extending in multiple directions. In order to enable this, the transmitter-receiver combination is further configured to transmit clock data from the second data clock (i.e. in this example the table) back to the first data clock (i.e. in this example the support structure STR). By sending the clock data to the second clock and back again to the first clock, information about the delays encountered with the transmission may be derived from the clock data as received back, e.g. by comparing the first data clock with the signal as twice transmitted. Thereto, in this embodiment, a control circuit or controller CON is provided to derive a synchronization from a comparison of the first data clock on the one hand and the clock data as transmitted to the second data clock (i.e. in this example the table TA) and transmitted back to the first data clock on the other hand. Adjustable (ie. variable) delay units TD are provided, which are under control of the control circuit CON. The adjustable delay units TD and the control circuit CON are comprised in synchronization circuit SYN. A first one of the delay units TD is provided in series with the transmission path from the first clock to the second clock. A second one of the delay units TD is provided in series with the transmission path from the second clock back to the first clock. In this embodiment, both delay units are provided at the side of the first clock, i.e. in this embodiment at the support structure STR. The control circuit is arranged to control the adjustable delay units TD such that a phase of the signal received at the first input thereof (namely the clock signal of the first data clock C1) equals in phase the signal received at the second input (namely the signal as transmitted forth and back and as delayed by both the delay units TD). In case of equal delay values of both adjustable delay units TD, a delay TA encountered by the wireless transmission to the second clock is compensated by the first one of the delay units TD, while the delay encountered by the transmission back to the first clock (ie. in this embodiment to the support structure STR) is compensated by the second one of the delay units TD. At the second clock (i.e. in this example at the table TA) the remaining delay caused by for example electronics, etc, may be compensated by a delay unit DLY which may for example be set to a calibrated delay value. The second clock C2 may be synchronized to or derived from an output signal of the delay unit DLY.

Figure 5:
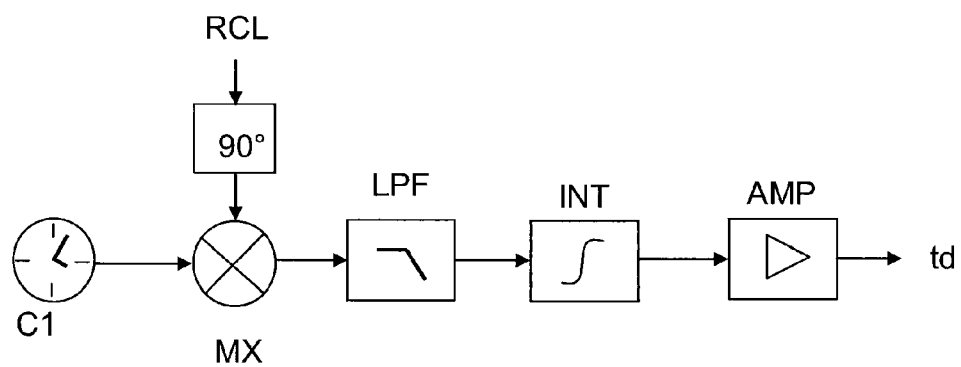
FIG. 5 depicts a schematic block diagram of a part of a synchronization circuit of the stage apparatus in accordance with FIG. 4 according to an embodiment of the invention.

An embodiment of the control circuit CON will now be explained with reference to FIG. 5. The clock data as received back (in FIG. 4 and FIG. 5 referred to as RCL) is delayed by a delay of 90 degrees phase delay. The first data clock C1 and the 90 degrees phase delayed received signal are then mixed by a mixer MX. As a result, a signal component at twice the clock frequency and a substantially constant (Direct Current DC) signal is obtained. The latter depends on a phase difference between the clock C1 and the received clock data RCL. This component is selected by low pass filtering using a low pass filter LPF, followed by integration by integrator INT and/or amplification by amplifier AMP so as to provide a control signal to control a delay of the adjustable delay units TD as depicted in FIG. 4, thereby being able to control the adjustable delay units td with sufficient loop gain and at a required accuracy.

The embodiments as described with reference to FIGS. 2-4 provide examples of a stage apparatus to position an object, the stage apparatus including: a table to hold the object, a support structure to support the table, the table being displaceable relative to the support structure, wherein the support structure comprises one of a first data clock and a second data clock and the table comprises the other one of the first data clock and the second data clock, the stage apparatus comprising a circuit to synchronize the data clocks, the circuit including: a transmitter and receiver configured to wirelessly transmit clock signal data from the first data clock to the second data clock, and a synchronization circuit to synchronize the second data clock to the first data clock from the wirelessly transmitted clock signal data as received by the receiver. Thereby, an accurate clock timing may be enabled at the stage, while obviating a need for wired transmission of clock signal data to the stage.

The second data clock C2 at the table may be applied to clock data acquisition (e.g. position measurement of the table position by position sensors such as encoders, interferometers, etc.), as well as to provide data to actuators/actuator controllers, etc.

The term data clock (also referred to as clock) may be understood as a circuit generating a repetitive signal that is intended for timing data operations, such as data acquisition, data processing, data storage, data communication, data output (e.g. to an actuator, driver etc), etc. Further, it is remarked that the term data clock may refer to the circuit that is configured to generate the repetitive signal, as well as to the repetitive signal itself.

The terms clock data and clock signal data are to be interpreted so as to include any kind of data clock related data: the repetitive clock signal itself, or any signal derived there from, related thereto, etc. In an embodiment, the clock data that is wirelessly transmitted comprises the repetitive clock signal itself (as such or modulated onto a carrier) so as to invoke no or little delays by conversion, processing etc.

The wireless transmission may include any type of wireless transmission, such as radio frequency, infrared, etc. The term circuit (circuit, synchronization circuit, etc) is to be understood as comprising any kind of electronic and/or electric circuit, including analogue and or digital electronics, discrete and/or integrated electronic and/or electric circuits, etc.

The stage as described may be applied in a lithographic apparatus and/or in other applications.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage apparatus to position an object, the stage apparatus comprising:
    a table configured to hold the object;
    a support structure configured to support the table, the table being displaceable relative to the support structure, the support structure comprising one of a first data clock and a second data clock and the table comprising the other one of the first data clock and the second data clock; and
    a circuit configured to synchronize the first and second data clocks, the circuit comprising
        a transmitter and receiver, the transmitter configured to wirelessly transmit clock signal data from the first data clock to the second data clock, and
        a synchronization circuit configured to synchronize the second data clock with the first data clock from the wirelessly transmitted clock signal data received by the receiver.

2. The stage apparatus of claim 1, wherein the transmitter and receiver comprise
    a first transmitter and a first receiver, configured to provide a first transmission path, and
    a second transmitter and a second receiver, configured to provide a second transmission path,
    wherein the first and second transmission paths extend in opposite direction along a first direction.

3. The stage apparatus of claim 2, wherein the synchronization circuit comprises a mixer configured to mix clock signal data received by the first and second receivers, and a high pass filter configured to select a second harmonic part of the mixed clock signal data.

4. The stage apparatus of claim 2, wherein the synchronization circuit comprises a mixer configured to mix the clock signal data received by the first and second receivers, and a low pass filter configured to select a substantially constant signal part of the mixed clock signal data.

5. The stage apparatus of claim 2, wherein the first direction is a direction of movement of the table.

6. The stage apparatus of claim 1, wherein the transmitter is configured to transmit clock signal data as received by the receiver from the second data clock back to the first data clock.

7. A stage apparatus to position an object, the stage apparatus comprising:
    a table configured to hold the object;
    a support structure configured to support the table, the table being displaceable relative to the support structure, the support structure comprising one of a first data clock and a second data clock and the table comprising the other one of the first data clock and the second data clock; and
    a circuit configured to synchronize the first and second data clocks, the circuit comprising
        a transmitter and receiver, the transmitter configured to wirelessly transmit clock signal data from the first data clock to the second data clock, and
        a synchronization circuit configured to synchronize the second data clock with the first data clock from the wirelessly transmitted clock signal data received by the receiver,
    wherein the transmitter is configured to transmit clock signal data as received by the receiver from the second data clock back to the first data clock, and
    wherein the synchronization circuit comprises
    a first adjustable delay unit configured to delay the first data clock prior to being transmitted to the second data clock,
    a second adjustable delay unit configured to delay a signal as received back at the first data clock, the synchronization circuit being arranged to synchronize the second data clock with the delayed first data clock as received at the second data clock,
    a controller configured to control the first and second adjustable delay units, the controller comprising a first controller input connected to the first data clock to receive the first data clock and a second controller input connected to an output of the second adjustable delay unit to receive the delayed signal as received back from the second data clock, the controller being arranged to control the delays of the first and second adjustable delay units so that the signal as received by the first controller input substantially equals in phase the signal received by the second controller input.

8. The stage apparatus of claim 7, wherein the controller comprises
    a phase delay configured to delay a signal received at the second controller input by a 90 degrees phase shift,
    a mixer configured to mix the first data clock at the first controller input with an output signal of the phase delay;
    a low pass filter configured to filter an output signal of the mixer; and
    an integrator configured to integrate an output signal of the low pass filter.

9. The stage apparatus of claim 7, wherein the controller is arranged to control the first and second adjustable delay units so that their delays substantially equal each other.

10. The stage apparatus of claim 1, wherein the object is a substrate coated with a radiation sensitive material.

11. The stage apparatus of claim 1, wherein the object is a patterning device configured to pattern a beam of radiation.

12. A lithographic apparatus arranged to transfer a pattern from a patterning device onto a substrate, comprising a stage apparatus of claim 1.

13. The lithographic apparatus of claim 12, wherein the stage apparatus is a patterning device stage or a substrate stage.

* * * * *